(12) United States Patent
Sutherland (10) Patent No.: US 6,304,125 B1
(45) Date of Patent: Oct. 16, 2001

(54) METHOD FOR GENERATING AND DISTRIBUTION OF POLYPHASE CLOCK SIGNALS

(75) Inventor: Ivan E. Sutherland, Santa Monica, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/146,815

(22) Filed: Sep. 4, 1998

(51) Int. Cl.$^7$ .................................................. G06F 1/04
(52) U.S. Cl. ........................ 327/295; 327/291; 327/141; 327/161
(58) Field of Search ..................... 327/291, 293, 327/295, 231, 237, 238, 239, 245, 243, 254, 255, 256, 257, 258, 259, 141; 326/21, 97; 365/233

(56) References Cited

U.S. PATENT DOCUMENTS

| | | | |
|---|---|---|---|
| 4,417,158 | * 11/1983 | Ito et al. | 307/269 |
| 4,554,465 | * 11/1985 | Koike | 307/269 |
| 4,700,347 | 10/1987 | Rettberg et al. | 371/1 |
| 5,306,962 | 4/1994 | Lamb | 327/295 |
| 5,646,554 | 7/1997 | Kim | 327/141 |
| 5,652,733 | * 7/1997 | Chen et al. | 365/233 |
| 5,663,994 | 9/1997 | Chu | 377/47 |
| 5,760,610 | * 6/1998 | Naffziger | 326/93 |
| 5,764,083 | 6/1998 | Nguyen et al. | 326/93 |
| 5,923,193 | * 7/1999 | Bloch et al. | 327/141 |
| 6,052,811 | * 4/2000 | Ahsuri | 326/21 |
| 6,188,262 | * 2/2001 | Sutherland | 327/295 |

FOREIGN PATENT DOCUMENTS

| | | |
|---|---|---|
| 0344736 | 12/1989 | (EP) . |
| 0463854 | 1/1992 | (EP) . |
| 0675596 | 10/1995 | (EP) . |

OTHER PUBLICATIONS

Glasser, L.A. et al., *The Design and Analysis of VLSI Circuits*, Addison–Wesley (1985), pp. 331–355.
*Clock Distribution Networks in VLSI Circuits and Systems*, IEEE Press, ed. Eby G. Friedman, (1993) pp. 1–31.
Weste, N.H.E., et al., *Principles of CMOS VLSI Design—A Systems Perspective*, Addison–Wesley (1985), pp. 203–224.
Gronowski, P.E., et al., "High–Performance Microprocessor Design," *IEEE Journal of Solid–State Circuits* (May 1998), 33(5):676–686.

\* cited by examiner

*Primary Examiner*—Timothy P. Callahan
*Assistant Examiner*—Linh Nguyen
(74) *Attorney, Agent, or Firm*—Townsend and Townsend and Crew LLP (57) ABSTRACT

A method of generating and distributing clock signals is described. The method provides synchronous clock signals in as many phases as a designer of a given circuit finds useful. The method acknowledges timing constraints of the controlled system, and adjusts the clock phases appropriately to meet the needs of the local data circuits using the clock signals. The method uses stages of clock signal generators which are coupled to appropriate portions of the datapath and to each other for controlling the datapath and to provide information about clock signal timing to each other. By adding delay elements, the method can also be used to test the design of the given circuit.

6 Claims, 8 Drawing Sheets

METHOD FOR GENERATING AND DISTRIBUTION OF POLYPHASE CLOCK SIGNALS

CROSS REFERENCE TO RELATED APPLICATION

This application is related to U.S. application Ser. No. 09/146,810, filed on Sep. 4, 1998, and entitled "Synchronous Polyphase Clock Distribution System."

BACKGROUND OF THE INVENTION

This invention relates to clock systems for control of computers or other electronic circuits, and in particular to a method for generating and distributing clock signals corresponding to phases of a master clock.

In the manufacture of computer systems and other circuits, clock signals are often provided to various elements such as components or circuits, on a single chip, or to elements scattered throughout the computer system itself. For a complex network of data communication paths, such as found in a conventional computer system, whether distributed on a single chip or over several chips, many clock signals must occur at times precisely related to the clock signals of adjacent parts of the system. In such a system, "adjacent" can mean parts of the circuit which are disposed relatively far away from one another but are adjacent in an electronic timing sense. As computer systems have evolved to operate at higher and higher clock speeds, the design and debugging of such clock distribution systems has become an extraordinarily difficult task.

In typical prior art computer systems, a master clock signal is generated for, or otherwise supplied to, a chip or printed circuit board. The clock signal is then distributed using conductive lines throughout the circuit. The designer of such a system must take great care to ensure that the clock signal arrives at an appropriate time at each of the circuits it controls. This is time consuming and expensive.

Typical prior art clock distribution systems are described in: Bakoglu, H. B., *Circuits, Interconnections, and Packaging for VLSI,* Addison-Wesley (1990); Glasser, Lance A., et al., *The Design and Analysis of VLSI Circuits,* Addison-Wesley (1985); Rettberg, Randall D., et al., U.S. Pat. No. 4,700,347, entitled "Digital Phase Adjustment" (October 1985); Eby Friedman, "Clock Distribution, " IEEE Press (1993); and Weste & Eschraghian, *Principles of CMOS VLSI Design,* 2nd edition, Addison-Wesley (1993).

SUMMARY OF THE INVENTION

The techniques described below provide a method for generating and distributing synchronous clock signals in as many phases as the designer of a given datapath circuit finds useful. We term such a system a "polyphase" clock distribution system because it produces as many clock phases as are necessary. The method of polyphase clock distribution system explicitly recognizes timing constraints of the datapath control so that each clock phase meets the specific needs of the local data circuits that use it. All clock signals are synchronous with the global clock signal, but each clock signal acquires a phase appropriate to local conditions.

An implementation of a polyphase clock distribution system consists of a network of simple circuits embodying the timing constraints of the computer or other circuit being controlled on the chip. Wherever there is a path on the chip for data to pass from one register to another, a corresponding segment of the polyphase clock distribution network provides clock signals for both sender and receiver. Each segment of the polyphase clock distribution network ensures the compatibility of the clock signals for its particular sender and its particular receiver. The receiver's clock signal lags that of the sender by enough time to permit data to flow, but by no more than necessary. The next clock signal at the sender follows the previous clock signal at the receiver by an interval long enough to avoid data ambiguity.

A complex chip has many datapaths, and its polyphase clock distribution system must have correspondingly many segments. These segments of the polyphase clock distribution system generally exhibit the same topology that appears in the datapaths on the chip. Where several datapaths on the chip meet, the corresponding segments of the polyphase clock distribution system will also meet. Generally there is a one-to-one correspondence between junctions of the datapaths and junctions of the segments of the polyphase clock distribution system.

At each junction of datapaths a register or latch serves as sender or receiver for the data paths coming into and leaving that junction. The clock for register or latch at the junction must be compatible with the needs of all the datapaths in which that junction register appears. The circuits in the corresponding junction of timing segments of the polyphase clock distribution system ensure that compatibility.

The method for generating and distributing polyphase clock signals ensures compatibility at each junction by delaying each clock event until all constraints on it have been met. For example, consider a register that takes data from several sources. The junction circuits of the polyphase clock distribution system time-position the clock signal that captures data into such a register late enough to ensure that all incoming data are available at the moment of capture, and time-position the clock signal to retain data until the data have reached all intended destinations.

If no external timing signal is provided, a polyphase clock distribution system will oscillate at the maximum frequency compatible with the timing constraints it embodies. For example, if the slowest datapath in the network requires X nanoseconds between its sending and receiving clocks, and Y nanoseconds between its receiving clock and the next sending clock, such a system can produce clock signals only every X+Y nanoseconds. Moreover, if these are the slowest constraints for the complete system, the entire polyphase clock distribution network will oscillate with a period of X+Y nanoseconds. The period of self-oscillation of the polyphase clock distribution system for a complex network is the shortest period compatible with all of the constraints it embodies. The system goes as fast as the constraints permit.

If a periodic timing signal with period longer than the self-oscillation period of the polyphase clock distribution system is injected into a polyphase clock distribution system, the polyphase system will everywhere adopt that period. The intended use of the polyphase clock distribution system is to distribute such a periodic signal throughout the chip. Each local clock signal will exhibit the same period and the same frequency, but each will have a unique phase determined by local need.

The method of generating and distributing polyphase clock signals provides numerous advantages over conventional clock distribution systems. For example, the polyphase clock distribution system controls clock skew in a local, rather than global, manner, thus simplifying the task of designing clock circuits. Moreover, the phase of local clocks matches the needs of local circuits. The global clock signals operate at lower power levels, acquiring higher power only locally where broad data paths require large drivers. The polyphase clock system makes "time borrowing," in which one stage of a pipeline "borrows" some time from another stage, relatively easy. Additionally, the phase of the local clock signals retains a proper phase relationship over a wide range of clock frequencies, including very low clock frequencies appropriate for reducing power consumption in certain modes of operation. As will be evident from the description below, the polyphase clock system enables modifications to the design of the datapath without requiring complete revision of the clock distribution system. Furthermore, electrical current demands are distributed more uniformly over the clock cycle than they are when a conventional clock is used. These advantages are discussed in more detail below.

In one embodiment of the method, polyphase clock signals are provided in a plurality of phases to an associated circuit. In its simplest form, the method provides a plurality of clock signal generators coupled together in series, with each clock signal generator providing a first control signal to the subsequent clock signal generator in the series to permit that clock signal generator to switch from a first state to a second state, and each subsequent clock signal generator provides a second control signal to the predecessor clock signal generator in the series to permit that clock signal generator to switch from the second state to the first state. In this manner, each stage produces a clock signal of a phase appropriate both to the circuitry being controlled and to the adjoining clock signal generators.

DESCRIPTION OF THE SPECIFIC EMBODIMENTS

Figure 1:
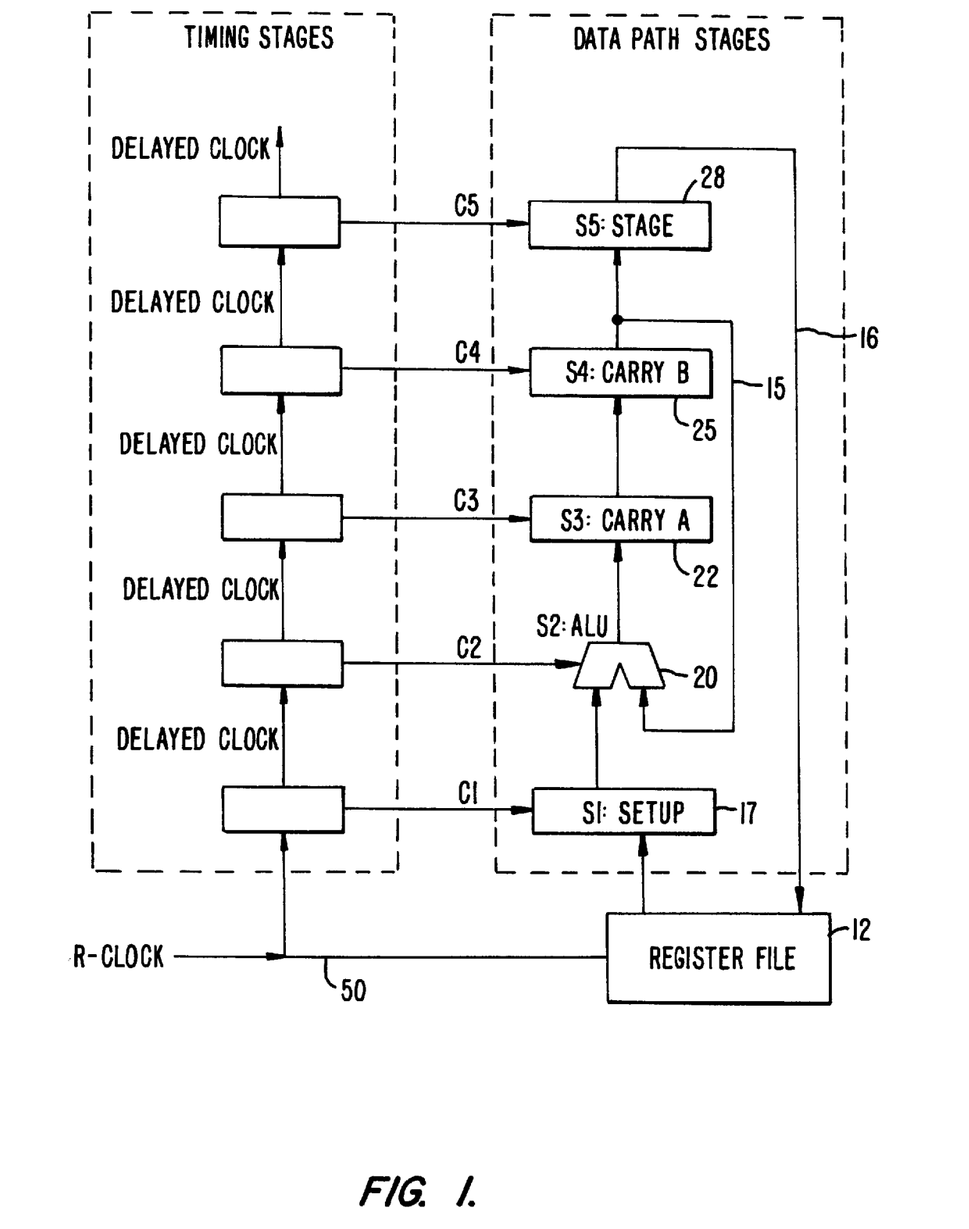
FIG. 1 illustrates a sample pipeline in a computer system which is controlled by clocks in multiple phases.

As described briefly above, this invention includes a system for creating and distributing a synchronous clock signal having multiple phases. To enable a better understanding of the invention, an illustrative synchronously clocked system will be used as an example. The example system is shown in FIG. 1 as a five-stage data pipeline that begins and ends at a clocked register file 12 and contains a single bypass loop comprised of interconnected elements 20, 22 and 25 as closed by path 15. (Hereinafter, where no ambiguity arises, loops will be designated by reference to their closing path; thus, bypass loop 15 designates the loop just defined.) Clock signals for controlling this datapath are produced by the series of timing stages shown at the left in the figure in which timing signals derived from the R-Clock signal 50 pass up a timing chain stage by stage, each stage generating a local clock signal C1, C2, . . . C5 of appropriate phase. The functionality of the data pipeline shown is irrelevant to an understanding of the clocking methods to be described, although the stages S1, S2, . . . S5 of this pipeline are labeled with typical functions each one might perform: that is, setup 17, arithmetic logic unit (ALU) 20, Carry A 22, Carry B 25 and Stage 28. The bypass loop 15 recirculates the results of the Carry B stage 25 back to the ALU stage 20. In FIG. 1 inherent latches (not shown) are used to capture the input signal data on the input node(s) of the apparatus of each datapath stage. Thus, for example, a latch will hold the input data on the input terminals of the Carry A stage, although other apparatus for holding data, for example a master-slave flip flop or latchless domino logic, could be used instead.

In the clock distribution system for this example, the goal is to provide for a single value to circulate in the bypass loop and for a total latency of two clock-period delays from register file 12 back to register file 12. For purposes of illustration, three latches (in ALU, Carry A, and Carry B) are in the forward path of the bypass loop 15 to show (later below) how the polyphase clock system can produce three different clock phases when required. Register file 12 is treated as a base that receives a synchronous clock. Although real embodiments of systems for performing arithmetic and logic functions will be much more complicated than shown in FIG. 1, the techniques illustrated in this example can be easily generalized to arbitrarily more complex systems.

Figure 2:
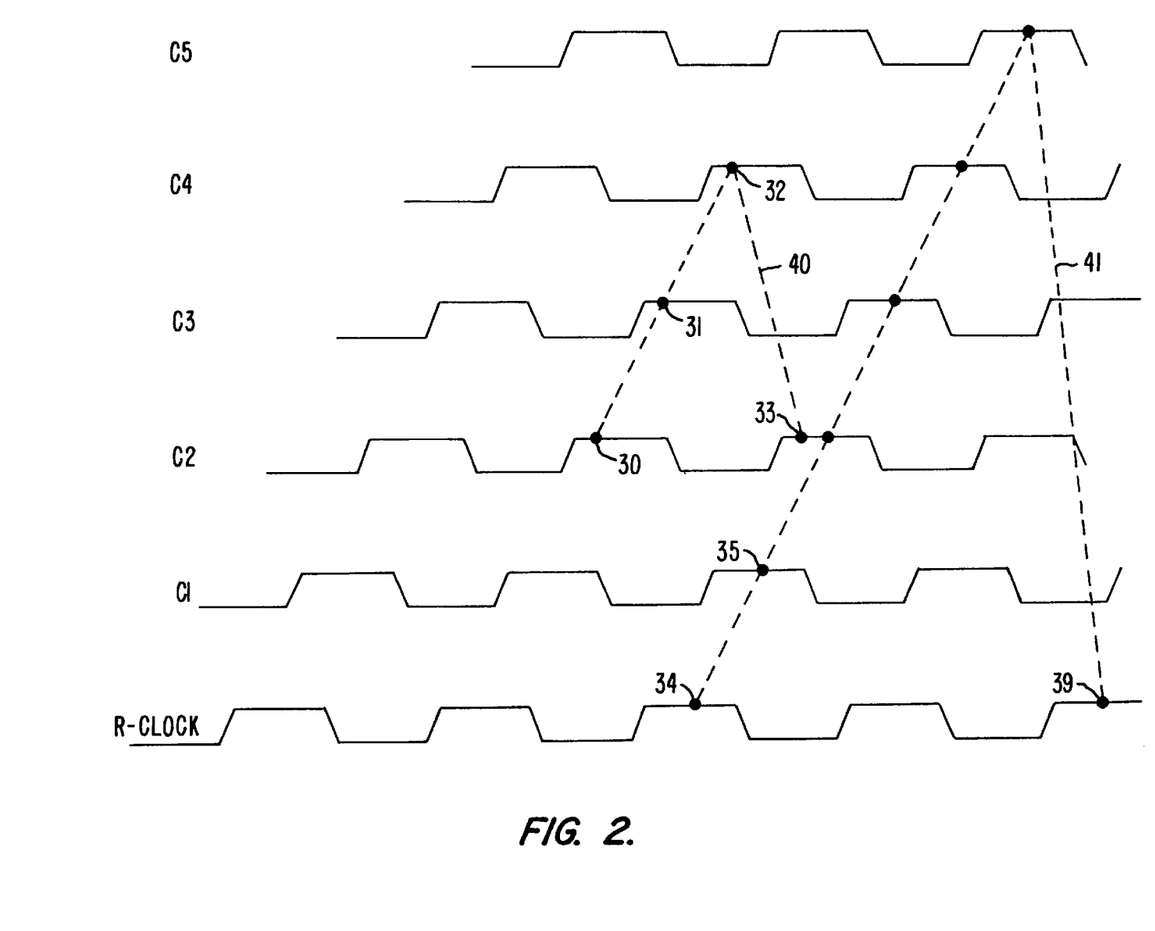
FIG. 2 is a timing diagram illustrating clock waveforms for the clock signals shown in FIG. 1.

FIG. 2 is a timing diagram which illustrates an arrangement of clock signals that could be used to drive the data pipeline stages of FIG. 1. A clock signal timing diagram for each of the signals R-Clock, C1, C2, . . . C5 as used in FIG. 1 is labeled correspondingly in FIG. 2. Exemplary timing points 30, 31, 32, 33, 34, 35, and 39 for operating the apparatus in FIG. 1 are illustrated by the dots on the waveforms in FIG. 2. The dashed lines connecting the dots form "tents" 40, 41 which group clock pulses that share a set of clock timing constraints; that is, the portions of the waveforms within the tents must have a predetermined relationship with one another to assure proper operation of the apparatus. The smaller tent 40 connects clock signals C2, C3, and C4, which form a group because a data value must circulate in the bypass loop. Notice that tent 40 is one clock period wide, as is necessary for the single data element circulating in the bypass loop. The point on the R-Clock waveform, in conjunction with points on waveforms C1–C5, form another such tent 41 or group, because a data value emerging from the pipeline must reenter the register file in a timely fashion. This larger tent 41 is two clock periods wide, as is necessary to maintain two data values in flight through the pipeline.

Figure 3:
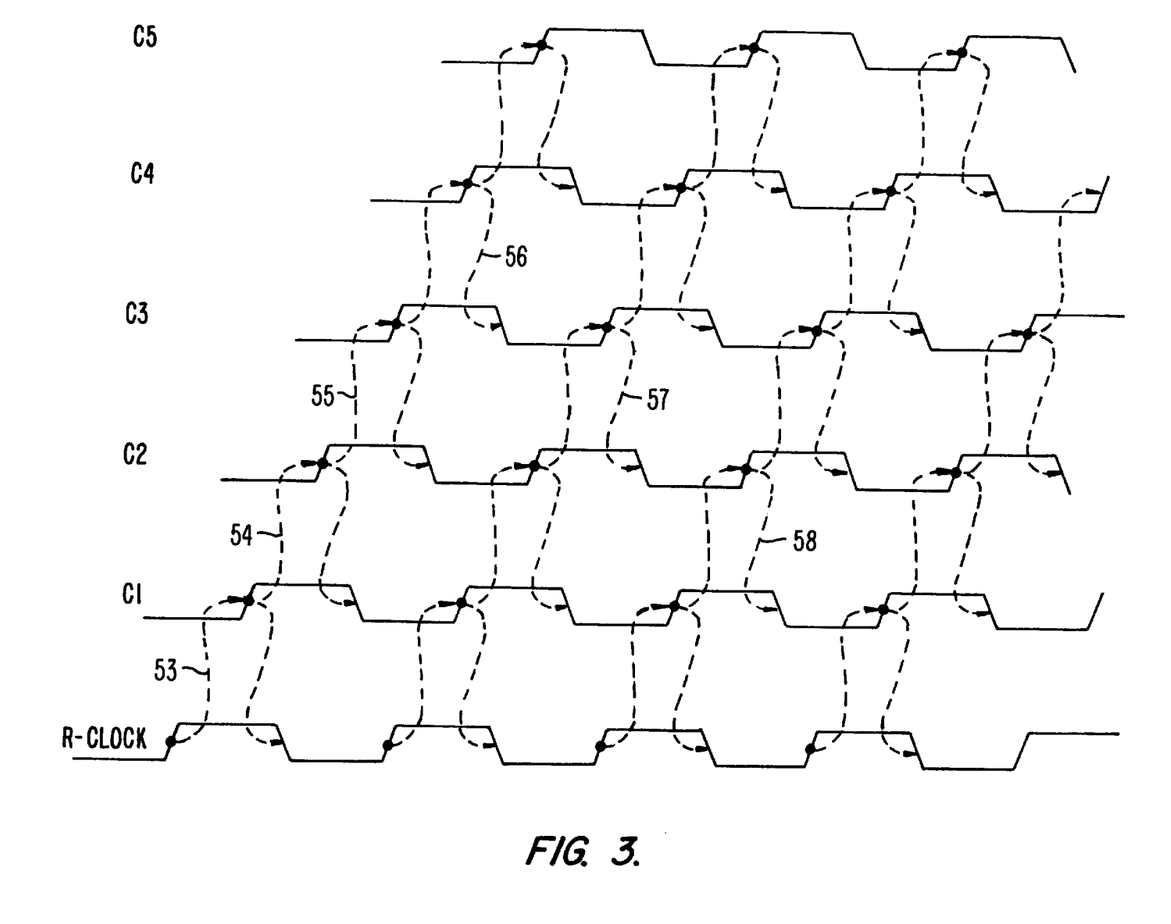
FIG. 3 is a timing diagram illustrating constraints on the clock waveform signals supplied by the various clock generator stages.

FIG. 3 is a timing diagram which illustrates the timing constraints implied by the clock distribution system of FIG. 1. First consider only the arrows extending upward in the figure, such as arrows 53, 54, 55, and ignore the arrows extending downward. Each clock edge of the clock signal C2, for example, depends only on the corresponding edge of its predecessor clock C1. In accordance with the architecture of the system, the designers of the circuitry within each datapath stage of FIG. 1 would be given clocks of specified duration and phase, and would then make their circuits fit into the resulting framework. Of course, instead of the configuration shown, one might use the R-Clock itself for C3, use C1 for C4, and use C2 for 1C5, recognizing that these pairs of clock waveforms are identical and shortening the timing chain accordingly. Such a configuration would provide a three-phase clock.

The system as thus far described (still ignoring the downward arrows) is an "open loop" clock distribution system. In such a system the phases of various clock signals must be planned carefully in advance on a global basis. Lengthening the clock period in such an open loop clock distribution system may result in failure of bypass loops. In the example, changes in clock period might violate the constraint between the C2 and C4 clocks imposed by the bypass path, or the constraint between C5 and Clock imposed by writing back into the register file. The latches inherent in the datapath of FIG. 1 imply additional constraints on the clock phases. These are illustrated in part by the downward arrows, such as arrows 56, 57 and 58. Considering the downward arrows, the constraints extend both up and down the page.

In FIG. 3, consider a HI signal as meaning "opaque" or "latched" (referring to the inherent datapath latches) and a LO signal as meaning "transparent" or "unlatched." (The terms "opaque" and "transparent" are more broadly applicable to systems that use domino logic, rather than explicit latches.) Thus, as suggested above and shown by arrow 55, clock C3 may cause corresponding datapath latch in stage S3 to become opaque, latching its received data only after clock C2 has caused stage S2 (the ALU) to latch data. In addition, however, the downward arrows represent constraints on falling clock edges, which themselves determine hold times. As illustrated by arrow 56, for example, these constraints indicate that clock C3 may not return its corresponding stage S3 to transparency and send fresh data toward stage S4 until after clock C4 has safely latched the previous data by forcing stage S4 to become opaque.

Figure 4:
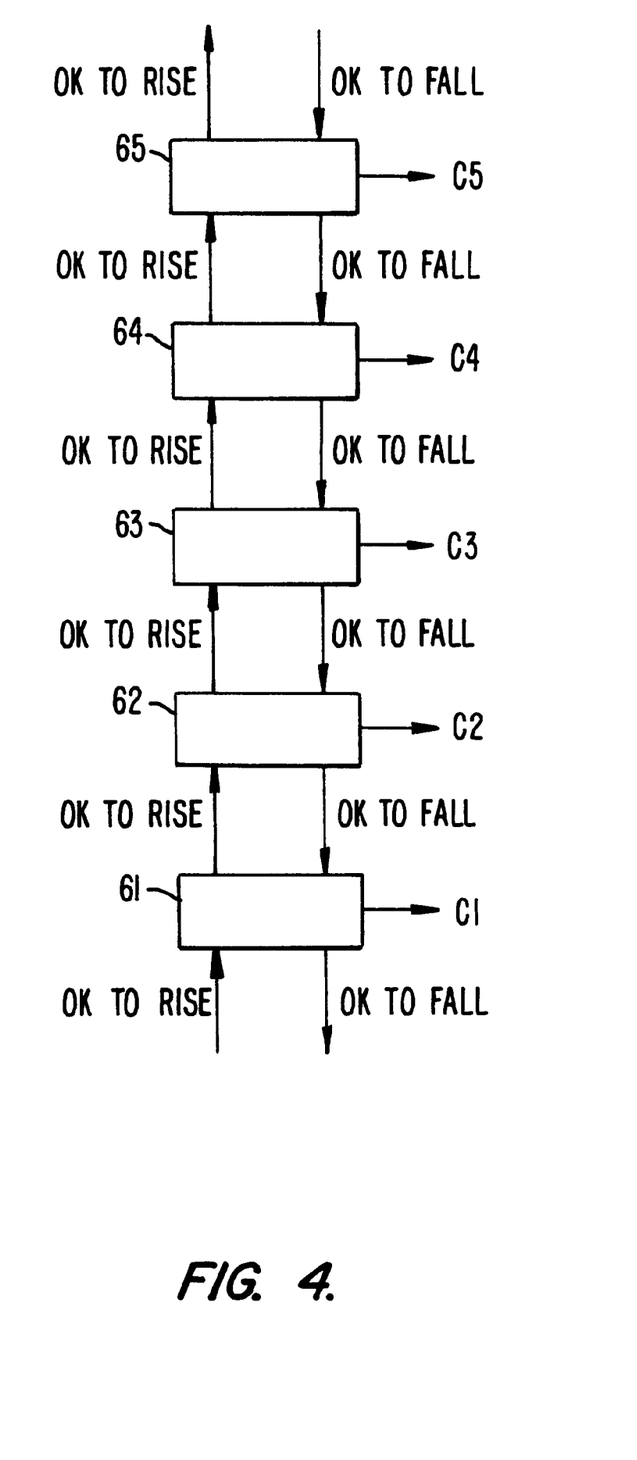
FIG. 4 is a block diagram illustrating a pipeline control circuit.

The constraints illustrated in FIG. 3 are adequate for a pipeline without bypass loops. That is, in FIG. 3, no action by a stage receiving a clock signal impacts stages other than its neighboring (predecessor and successor) stages. One way to generate clock signals such as these for use in a pipelined datapath while including explicit recognition of the reverse-direction constraints is shown in FIG. 4. As depicted, individual timing stages 61, 62, . . . 65 generate corresponding clock signals C1, C2, . . . C5. Signals labeled "OK to rise" travel up this control system, corresponding to the upward arrow constraints of FIG. 3. Signals labeled "OK to fall" travel down this control system, corresponding to the downward constraints of FIG. 3. Each timing stage 61, 62 etc. responds only after receiving the appropriate "OK" next required. In this manner the necessary clock signals are generated (again ignoring the bypass path).

The bypass path 15 of FIG. 1 imposes additional constraints on the clocks for the stages in that loop. These additional constraints appear as darker dashed lines 70, 71, 72, 73, 74 and 75 in FIG. 5. The latches controlled by clock C2 (on the input nodes of ALU 20) may capture new data by becoming opaque or latched only after both clocks C1 and C4 have caused the capture of data. Thus there is a double constraint on the rising edge of clock C2. This double constraint is illustrated by the presence of two arrows 70, 76 having pointers to the rising edge of clock C2. Similarly, clock C4 may not cause a return to transparency in its corresponding datapath stage S4 until after both clocks C2 and C5 have caused the capture of data from stage S4, the stage controlled by clock C4. Thus there is a double constraint on the falling edge of clock C4. This double constraint is illustrated by the presence of two arrows 73, 77 having pointers to the falling edge of clock C4.

Figure 5:
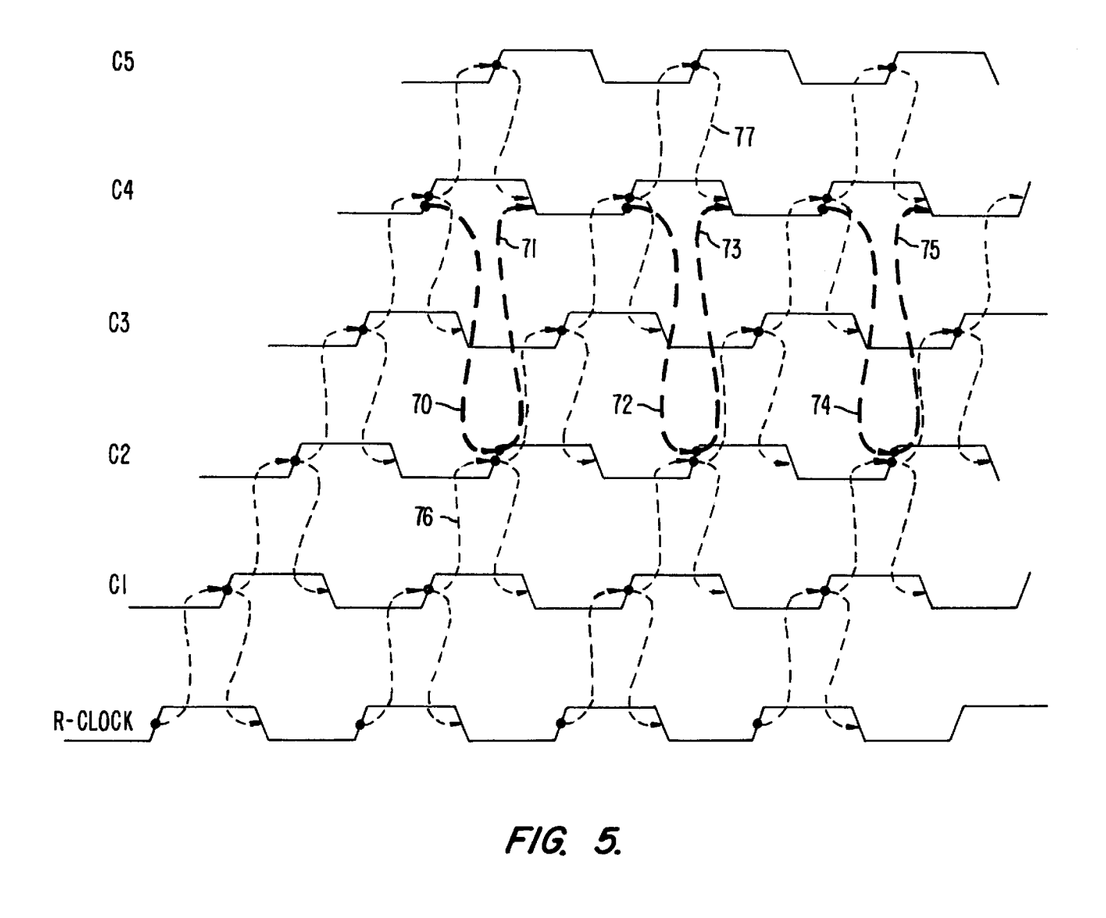
FIG. 5 is a timing diagram illustrating the constraints imposed by the bypass loop in the circuit of FIG. 1.
Figure 6:
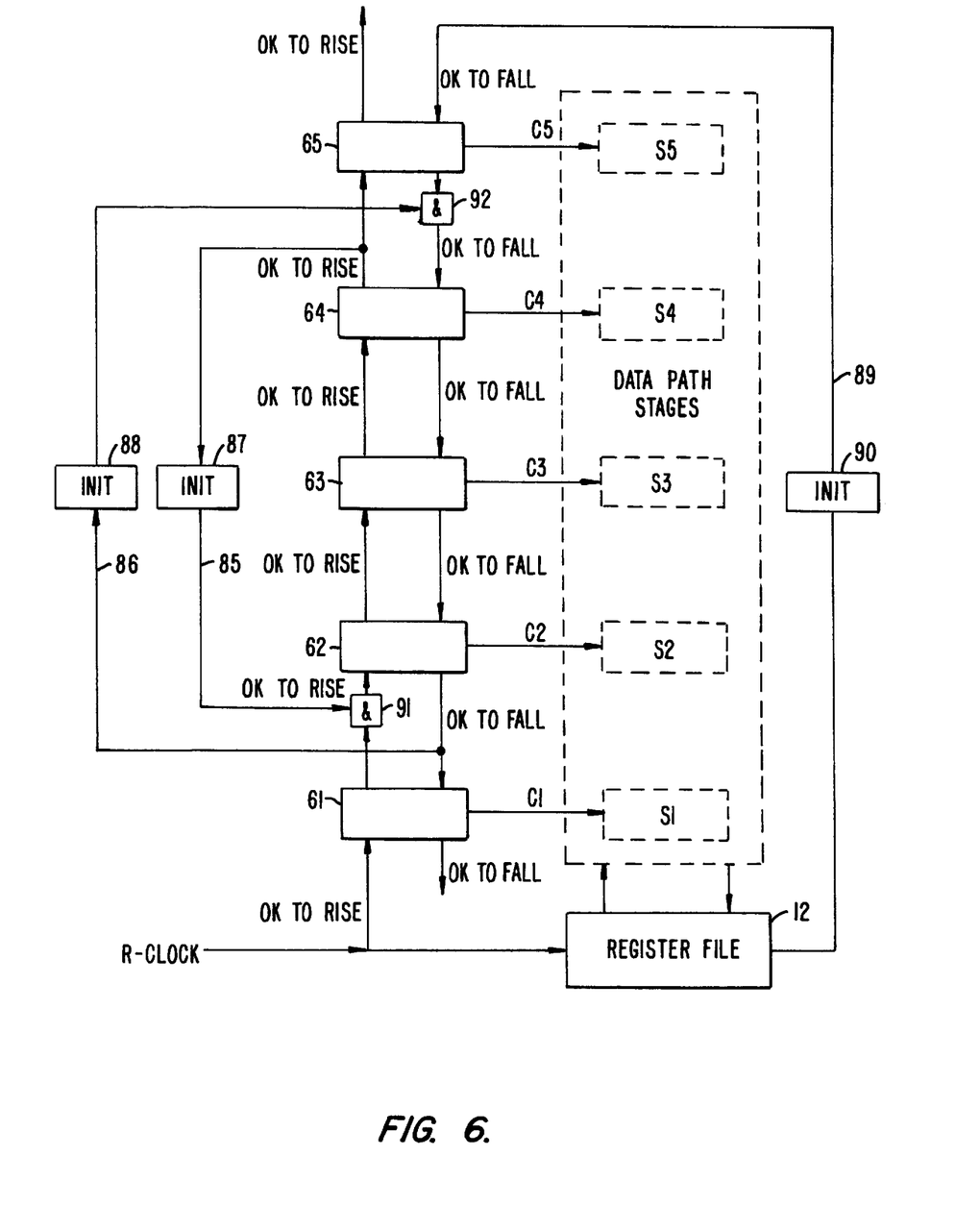
FIG. 6 is a block diagram of the clock generator shown in FIG. 1 but including bypass loops.

FIG. 6 is a block diagram of the clock generation system for producing the waveforms of FIG. 5. As before, the clock generator includes a series of timing control stages 61, 62, . . . 65 for producing the corresponding clock signals C1, C2, . . . C5 in a phased relationship with one another. This system, however, includes explicit control signals over paths 85 and 86 between timing stages 62 and 64 that guarantee their phase relationship. The boxes 87, 88 labeled "init" in FIG. 6 provide the control "token" that circulates around the bypass-loop pair 85, 86. The smaller boxes containing the ampersand (&) indicate that both the signal on bypass loop 85(/86) and the "OK to rise"(/"OK to fall") signal from the stage 80(/84) must be present for the next stage to proceed. In other words, the ampersand represents a gate that performs the AND function.

There is substantial similarity between the topology of the clock distribution system of FIG. 6 and the topology of the datapath of FIG. 1. The bypass path 15 in FIG. 1 engenders a corresponding path-pair 85, 86 in the clock distribution system, while the outer path 16 back to the register file 12 (FIG. 1) engenders a corresponding outer path 89 in the polyphase clock distribution system. Because the register file delivers its output signals on a regular schedule, R-Clock "tells" the first timing stage 61 when it may rise (that is, produce a rising transition on clock C1), although the register file ignores the returning "OK to fall" signal from timing stage 61. Similarly register file 12 captures data from datapath stage S5 on a regular schedule and thus instructs timing stage 65 when it is "OK to fall" (that is, produce a falling transition on clock C5), although register file 12 ignores the corresponding "OK to rise signal" from timing stage 65.

When employing the polyphase clock distribution system, it is the responsibility of the designer to ensure that the first and the last stages, 61 and 65, respectively, of the timing pipeline are ready at the appropriate time (absent these stages' being coupled to other stages responsible for this timing). The timing stages included between stages 61 and 65 themselves assure the proper phase relationship between local clocks. To ensure proper operation of the whole system the designer need consider only the internal requirements and the end conditions.

If the bypass loop is idle it may be possible to avoid the timing constraint the loop imposes when used. In such cases one might gain speed over a conventional clock distribution system, which operates on a rigid schedule. Our experience to date, however, suggests that, in most situations, avoiding such constraints when the data values show them to be unnecessary is more difficult than beneficial. Thus, generally, systems are preferred in which potential loops in the datapath engender corresponding loops in the polyphase clock distribution system, whether or not data actually flows around such datapath loops.

Figure 7:
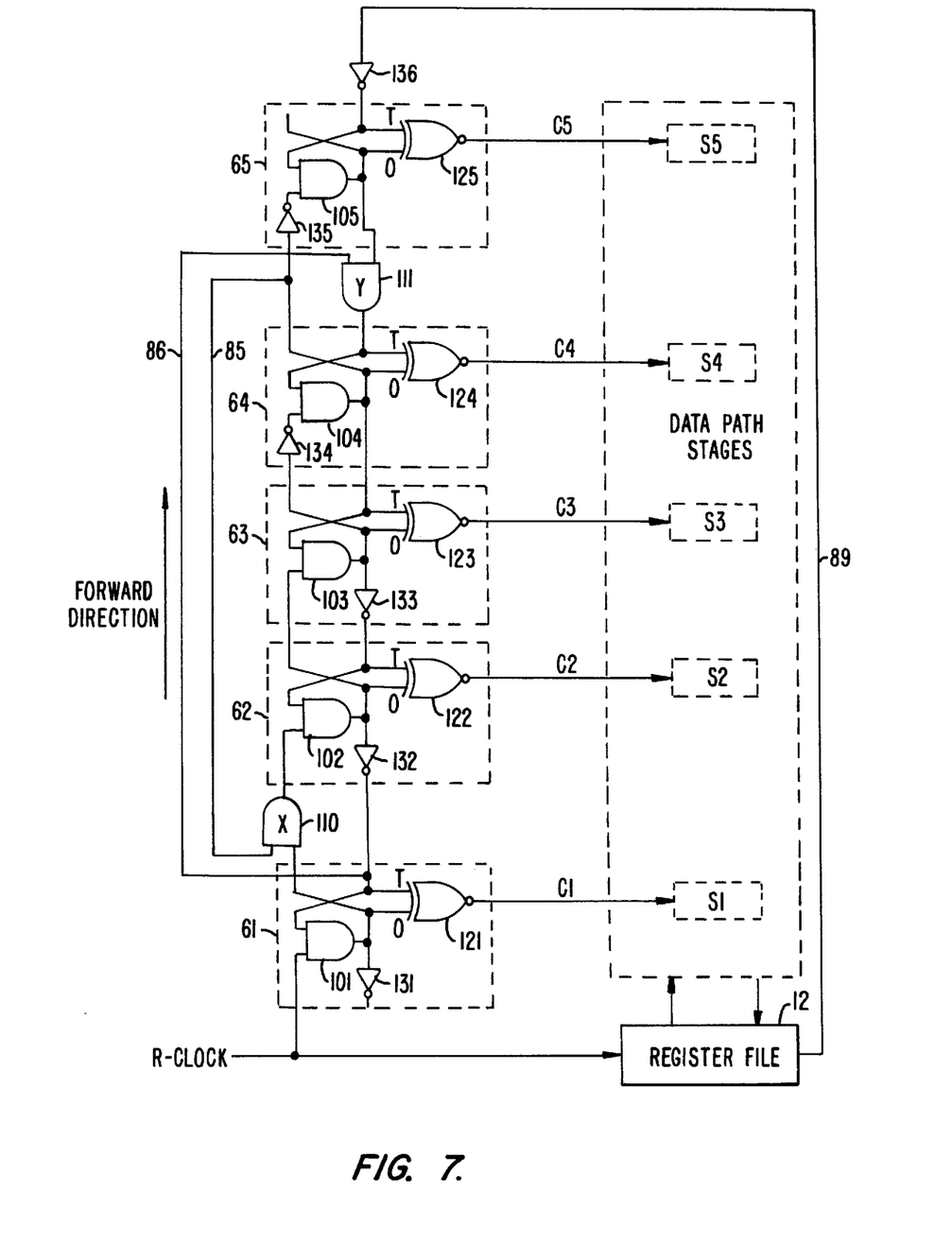
FIG. 7 is a more detailed diagram illustrating the constituents of the block diagram shown in FIG. 6.

FIG. 7 is a block diagram of a specific implementation of a polyphase clock distribution system, using the datapath of FIG. 1 as an example. The circuit in FIG. 7 includes Muller C-elements 101, 102 . . . 105 to distribute clock signals that are synchronous in frequency. These Muller C-elements produce local clocks whose phases meet the constraints imposed by the datapath. Such a system provides clock signals in as many phases as the datapath circuits find useful, and matches the phase of each local clock to the local need. A Muller C-element produces a HI output signal only after both its input terminals become HI, and produces a LO output signal only after both its input terminals subsequently become LO. This implies that the Muller C-element retains its previous output state when the state of its input terminals differ. Importantly, in the polyphase clock distribution circuits it is never the case that the state of one of the input terminals of a Muller C-element is changed twice in sequence without changing the state of the other. In the polyphase clock distribution system, both input terminals will change state in every case, causing a corresponding change in the output signal, before either input terminal changes state again.

Although the Muller C-element is described here for an exemplary implementation, other circuit elements, such as a "rendezvous" element, may also be used. A rendezvous element generates an error signal if given an input that is out of sequence, whereas the Muller C-element merely accepts it.

The clock generator circuits described herein use event signing, although other forms of signalling may also be employed. In event signaling the simplest element is a change of level, a transition called an "event." Whether the transition is from LO to HI, called a rising event, or from HI to LO, called a falling event, makes no difference. Each is an event and both are treated alike.

A Muller C-element is said to "fire" when its output terminal changes state. When the Muller C-element fires, it produces an event on its output terminal. As discussed, a Muller C-element fires in response to changes in the state of both of its input terminals; thus, the Muller C-element provides the AND function for event logic. The XOR (or XNOR) circuit serves as the OR function for event logic. An XOR/XNOR element changes the state of its output terminal if either of its input terminals changes state. Thus it produces an event at its output in response to an event at either input. Importantly, in the polyphase clock system, both input terminals of an XOR/XNOR do not change at the same time. Some published papers distinguish between a "merge" element and an XOR/XNOR circuit. A merge element produces an error signal if given a subsequent event on either input terminal before it can respond to the previous input signal. Thus, the polyphase clock distribution circuits could use merge elements instead of XOR/XNOR circuits. Alternatively, the system could use a special case of the merge element known as the "inverse toggle" element. See commonly assigned U.S. patent application Ser. No, 08/813, 054, filed Mar. 7, 1997, and entitled "Inverse Toggle XOR and XNOR Circuit." An inverse toggle element receives input events alternately on its two input terminals. Thus an event at one input terminal always makes its output terminal HI and an event at the other input terminal always makes its output terminal LO.

The more detailed implementation of a polyphase clock circuit shown in FIG. 7 illustrates the core of each of the timing stages 61, 62, . . . 65. Each timing stage contains at least one shield-shaped Muller C-element 101, 102, . . . 105. When, for example, the Muller C-element 102 fires, indicating that its corresponding datapath stage has become opaque, event signals go to both adjacent stages. For the subsequent timing stage 63 above, this signal corresponds to the upward constraint on the waveforms of FIG. 4. That is, the firing of a Muller C-element indicates that its related datapath stage has become opaque and that the datapath stage above may also capture this data. For the previous datapath stage S1 below, this signal corresponds to the downward constraint of FIG. 4. It indicates that stage S1 may now discard the data it holds, become transparent, and ultimately convey a new data value upward.

The operations just described can occur extremely quickly. At Sun Microsystems Laboratories (a subsidiary of the assignee herein), a circuit was built consisting of a chain of stages like stage 63, but connected into a closed ring. That circuit operates in about five gate delays per cycle. Using 0.6 micron CMOS integrated circuit technology, the internal throughput of the regular stages is nearly 1 gHz and the corresponding cycle time only slightly more than one nanosecond.

In FIG. 7 the timing stages 64 and 65 producing signals C4 and C5 have inverters in a configuration different from that of timing stages 61, 62 and 63. These inverters 134 and 135 establish initial conditions within the timing bypass loops that correspond to the datapath loops. The position of inverter 134 ensures that the timing bypass loop 85 starts with one control token, thus ensuring that, in the datapath bypass loop 15 (FIG. 1), one of the three stages S2, S3 or S4 remains opaque. The two inverters 134 and 135 together ensure that the larger loop 16 (FIG. 1) will always contain two data elements as required.

Next, further consider the bypass loop 15 (which induced the dark-line constraints 70, 71, 72, 73, 74, and 75 of FIG. 5). FIG. 7 exhibits the corresponding timing loop-pair 85, 86. The stages 62, 63, and 64 together provide a three-phase oscillator. FIG. 7 also includes two additional Muller C-elements 110, 111 that serve as the AND gates 91 and 92 of FIG. 6. These Muller C-elements 110, 111 coordinate the actions in timing loop-pair 85, 86 with the actions in the timing stages above and below it. Before Muller C-element 102 can fire, for example, Muller C-element 110 must receive both an "OK to fire" signal from Muller C-element 101 below and a similar signal from Muller C-element 104 via path 85.

Also shown in FIG. 7 are XNOR gates 121, 122, . . . 125 that deliver the clock signals C1, C2, . . . C5. The input terminals to these XNOR gates are marked T and O corresponding to "transparent" and "opaque" respectively. An event on an O input always makes the corresponding datapath latches opaque, and an event on a T input always makes the corresponding datapath latch transparent. Because the two input signals to these XNOR gates 121, 122, . . . 125 change alternately, an inverse toggle implementation as mentioned above could be used for greater speed. When the inputs to the XNOR gate differ in state, the LO outputs from the XNOR gates on C1–C5 make the corresponding datapath latches transparent, while a HI output makes them opaque.

FIG. 7 also shows the connection of the timing pipeline to receive the clock signal R-Clock driving the register file 12. The connection to the clock is unusual in that the clock delivers events rather than a level to the Muller C-element 101 associated with stage 61 that provide clock C1. This is the "OK to rise" event also shown in FIG. 6. The register file also delivers an event input to the Muller C-element 105 of stage 65 providing clock C5. This is the "OK to fall" signal also seen in FIG. 6. Because the circuit shown uses event logic, these two signals are event signals derived from the R-Clock signal at the register file 12.

Each R-Clock event provided to register 12 puts a new data element in at the bottom of the pipeline and takes one out at the top, so if there are two data elements initially, there always will be two. Below we discuss how two data elements are introduced initially into the chain of stages. The manner of achieving this involves the inverters 131, 132, . . . 135 and the correct initialization of the Muller C-elements.

Three of the timing stages 61, 62, 63 have downward facing inverters 131, 132, and 133. These correspond to datapath stages S1, S2, S3 that are initially empty. Two timing stages 64, 65 have upward facing inverters 134, 135.

These correspond to stages that are initially full. By carefully placing inverters in this manner, pipelines can be made with arbitrary loop structures to contain an arbitrary number of initial elements and place those elements in arbitrary initial positions. Of course, the initial data held in datapath stages initially full could also be initialized to zero or marked as invalid.

The number of initially full elements establishes the latency, in clock periods, of each branch of the circuit. In this example one timing stage 64 of the bypass loop is initially full. This corresponds to the width of the smaller "tent" 40 in FIG. 2. The outer loop has two full timing stages 64, 65 one of which it shares with the bypass loop. This corresponds to the width of the larger "tent" 41 in FIG. 2. The "tents" of FIG. 2 describe how many stages need reversed inverters. The choice of which stages to make full initially is otherwise arbitrary.

Next, consider what happens when the R-Clock signal goes HI. The register file captures the data offered by datapath stage 5. Moreover, the change on the upper input terminal of the timing stage 65's XNOR gate 125 renders the latches in datapath stage S5 transparent, allowing the data from datapath stage S4 to flow into them. Shortly thereafter the Muller C-element 105 of timing stage 65 fires, rendering the latches of S5 opaque once more and presenting a LO input to the downward facing Muller C-element 111.

Meanwhile, at timing stage 61, Muller C-element 101 fires, rendering the latches of stage S1 opaque. They have now captured the data presented by the register file. The upward facing Muller C-element 110 now has two HI input terminals and fires, which causes the timing stage 62 Muller C-element 102 to fire also, rendering the latches in stage S2 opaque. The register file data are now captured in stage S2.

When Muller C-element 102 in timing stage 62 fires, it sends an event signal to three places: up and down to the adjacent timing stages 61 and 63, and also to stage 64. In timing stage 61, this event renders the latches in stage S1 transparent again Similarly, the signal up to stage 64 via XNOR 124 renders datapath stage S4 transparent. Finally, timing stage 63 fires capturing the data from datapath stage S2 into S3 by making the datapath stage S3 latches opaque and datapath stage S2 latches transparent. Now stage 64 can fire, transferring data from S3 to S4. The first register-file data end up in stage S4, leaving it full, just as it was at the beginning of the cycle.

Each clock event similarly puts a new data element into stage S1 and takes one out of S5. If clock events occur slowly, data elements reside in stages S4 and S5 between clock events. The data element in stage S5 can advance no further until the next clock event. The data element in stage S4 can advance no further because it is needed in the next cycle by stage S2. Stages S1, S2 and S3 are empty, and stage S2 has the stage S4 data available to it.

Figure 8:
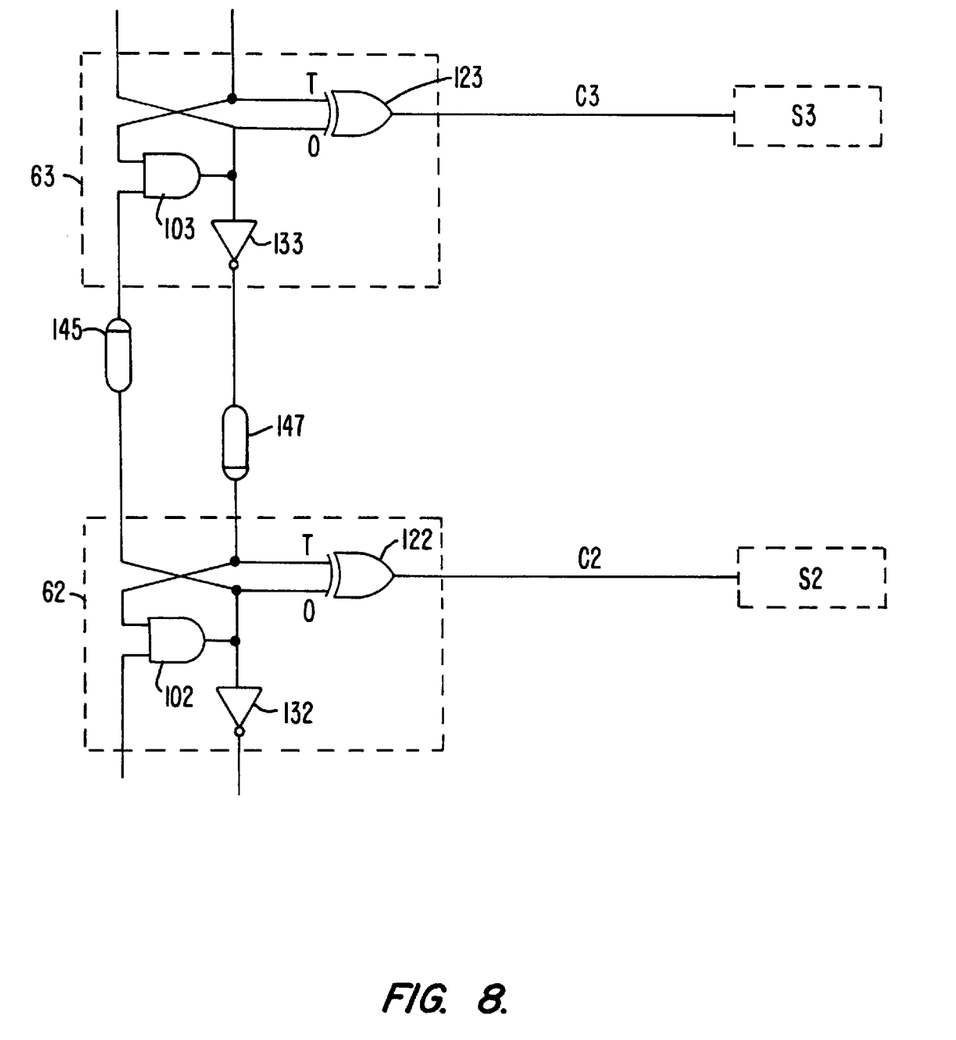
FIG. 8 illustrates the introduction of delay elements between timing stages shown in FIG. 7.

If clock events occur more frequently, data have less time to advance between clock events. At design speed, one data value arrives in stage S4 just as the next data value arrives in stage S1 so that stage S2 has both its required data values available at the same time. Moreover, a datum arrives at stage S5 just in time to be captured by the register file when stage S1 gets the next offering from the register file. At full operating speed the local clocks C1, C2, . . . C5 occur as shown in FIG. 5. Of course, one must include delay elements between timing stages in the circuit of FIG. 7 to reflect the local timing bounds of the datapath stages. FIG. 8 shows, for example, delay elements 145 and 147 introduced between timing stages 62 and 63. Although the sequence of events remains as described above, the actual delays required between events depend on the details of the datapath.

One unusual aspect of the polyphase clock system described herein is its flexibility. The pipeline of stages, each stage with a latch, holds exactly two data elements at any one time. It has a latency of two clock periods and an internal loop of one clock period. The polyphase clock distribution system recognizes precisely the real constraints of the actual datapath, ensuring that they are met.

The task of building such a clock distribution system can be divided into a separate part for each stage. Each part communicates only with those parts of the clock distribution system that correspond to sources or destinations of data for that stage. Each part embodies the delay constraints of its local section of the datapath. Overall function is assured provided only that (1) every part of the system has adequate throughput and (2) the actual latency of each branch of the design is less than the number of clock intervals assigned to it. The polyphase clock distribution system can accommodate any number of loops or special communication paths desired and put as many latching elements in them as we wish. One technique for designing such circuits employs P3 notation and is described in our copending commonly assigned U.S. patent application Ser. No. 08/953,767, entitled "Method and Modules for Control of Pipelines Carrying Data Using Pipelines Carrying Control Signals" and filed Dec. 17, 1997.

In addition to being used as an implementation technique, the polyphase clock can be used as a design tool. Simulations of a polyphase clock distribution network expose incompatibilities in the timing constraints it embodies. The polyphase clock offers a way to codify, capture, model and simulate the timing constraints in a complex chip.

To build a polyphase clock system one must determine the timing constraints of the datapaths it will control. A complex chip may have hundreds or thousands of such local timing constraints. Having collected such timing constraints, a model polyphase clock distribution network can be built. Because the self-oscillation speed reflects the totality of timing constraints embodied in the system, the self-oscillation speed of such a model will reveal the maximum speed at which such a system can run. For example, a long loop of datapaths might force slower operation than is required by any one link in such a loop. Early exposure of the joint implications of diverse delay constraints is provided.

Moreover, such a model will reveal not only the speed limits of a set of timing constraints, but will also reveal which constraints limit the overall speed. By examining the behavior of the polyphase clocking circuits one can discover which datapaths operate fast enough and which are the ones that limit overall speed. This information can be used in improving the design for faster operation.

The polyphase clock distribution system also makes it possible to check operating margins. For this purpose the timing stage delay must be made variable by replacing delay elements 145, 147 . . . with variable-delay elements. Control of these delay elements can be achieved by providing next to each such delay element a small control register, whose value sets the delay to be nominal, or slower or faster than nominal by an amount chosen to be useful for testing. Commercially available semiconductor test equipment can be used to put values into these control registers, forcing parts of the chip to operate a variable amount faster or slower than nominal. The test equipment can stress a particular datapath either by hastening the clock signal at its receiver or by delaying the clock signal at its sender. The equipment can test each datapath by gradually increasing the stress on it until it fails. Such a mechanism permits operating margin testing with detail not hitherto available. A record of the stress at failure for each datapath will measure how robust the chip is. It may also be desirable to detect incipient failure of particular chips by noticing that they fail under uncharacteristically small stress on some data path. Detecting such failures before they become problems at normal speed operation is valuable. Consistent failure under small stress of the same datapath in all chips reveals, design weakness. Consistently correct operation under large stress of the same datapath in all chips can reveal overdesign and lead to product improvement. Comparison of the margins in each datapath typical for many chips would focus further design efforts to enhance performance.

As evident from the preceding discussion, the polyphase clock system described above has many advantages. The polyphase clock distribution system recognizes that each connection from a datapath imposes a constraint on the clock signals. The system includes circuits to embody those constraints, Where there is no connection in the datapath there is no clock constraint, and there is no connection in the clock distribution system. Thus the circuits in the clock distribution system embodying the constraints imposed by the datapath form a network whose topology closely matches that of the datapath.

The skew between clocks for registers that have only indirect interaction can be ignored. This makes unnecessary the meeting of any artificial constraint imposed by a global clock skew specification. The polyphase clock distribution system recognizes the actual constraints on clock skew imposed by the datapath and represents them as local circuits. Thus it converts the global engineering problem of chip-wide clock skew into the local task of identifying and representing the real constraints.

Sometimes it is desirable to have one stage of a pipeline "borrow" some time from an adjacent stage. Such time borrowing is handy when successive stages in the pipeline have different intrinsic delay. It is desirable to adjust the clock for the latch between them to give more time to the longer and less to the shorter. The polyphase clock distribution system permits the clock of any latch to have any desired phase, including a slightly delayed or advanced phase where time borrowing is necessary.

The polyphase clock system also saves power. The signals that coordinate clocks in a polyphase system operate at low power levels. The gates involved are simple. Where it is necessary to drive long wires, repeaters may be used. Moreover, every long communication path in the data handling part of the system will have a parallel path in the clock distribution system. Repeaters in this part of the clock distribution system can provide local clocks for repeating latches or registers in the long datapath.

Another advantage is that because the clock distribution system parallels the datapath, it is easy to adapt the clock distribution system to local datapath changes. Each such change requires only a local change to the clock distribution system; because the timing constraints in other parts of the system did not change, the clock distribution system at those point does not need to be changed.

As discussed, a polyphase clock distribution system produces local clocks in a wide variety of phases. Each stage will draw current on a schedule determined by the phase of its local clock. The large number of such local clocks and the independence of their phases results in total current more uniform than would be the case in a system that produces local clock signals all in phase with little skew. This reduces the need for local bypass capacitors and reduces supply voltage variation caused by inductance in the power supply leads.

Yet another advantage is that with a polyphase clock distribution system the number of latches or latch equivalents in a pipeline can be larger than the latency of the pipeline in clock intervals. As part of the architecture a number of clock intervals latency can be assigned to each pipeline. The local designer is free to include more registers or latches, or domino latch equivalents, as a matter of design convenience. The polyphase clock distribution system provides appropriate local clocks to as many such latches as desired. This can be of major importance in a loop of domino logic in which three or more domino stages must be included in a pipeline for each clock interval of assigned latency.

The foregoing has been a description of embodiments of the invention. It will be appreciated that numerous departures from the specific circuitry shown may be made without departing from the spirit of the invention, which is further defined in the appended claims and their equivalents. For example, the system described here encodes events as transitions, but other encodings are also possible.

What is claimed is:

1. A method of distributing clock signals within a system comprising:

providing clock signals in a plurality of phases to an associated circuit, a first clock signal circuit coupled to separate a second clock signal circuit from a third clock signal circuit; and using the first clock signal circuit to control the second and the third clock signal circuits and the corresponding portions of the associated circuit; whereby the second clock signal circuit is precluded from changing to a new state until the first clock signal circuit has changed to that state, and the first clock signal circuit is precluded from changing back to the first state until the second clock signal circuit has changed to the first state; and wherein in a system the first clock signal circuit includes a first logic element having a first input terminal coupled to a first input node and a second input terminal coupled to a second input node and having an output terminal coupled to a first output node, and having a second logic element having a first input terminal coupled to the second input node and a second input terminal coupled to the first output node, and an output terminal coupled to the associated circuit:

detecting a change in state of both of signals applied to the first input terminal and the second input terminal of the first logic element, and in response thereto changing the state of the output terminal; and detecting a change in the state of either of signals applied to the first input terminal or the second input terminal of the second logic element and in response thereto changing the state of its output terminal.

2. A method as in claim 1 further comprising:

connecting a first delay element to the first input terminal to delay signals arriving at the first input terminal; and connecting a second delay element to the first output node to delay signals supplied from the first output node.

3. A method as in claim 2 further comprising changing the delay of the first delay element and the second delay element to test the associated circuit.

4. A method for providing clock signals in a plurality of phases to an associated circuit, the method comprising:

dividing the associated circuit into at least a first stage, a second stage, and a third stage, each coupled to a corresponding first, second, and third clock signal circuit having different timing requirements for receipt of clock signals;

from the first clock signal circuit generating a first clock signal which transitions between a first state and a second state and providing the first clock signal to the first stage;

from the second clock signal circuit generating a second clock signal which transitions between a first state and a second state and providing the second clock signal to the second stage;

from the third clock signal circuit generating a third clock signal which transitions between a first state and a second state and providing the third clock signal to the second stage;

after a transition between the first state and the second state, generating a first signal at the first clock signal circuit and providing the first signal to the second clock signal circuit to thereby permit the second clock signal circuit to change from the first state to the second state; and after a transition between the first state and the second state, generating a second signal at the second clock signal circuit and providing the second signal to the first clock signal circuit to thereby permit the first clock signal circuit to change from the second state back to the first state;

after a transition between the first state and the second state, generating a third signal at the third clock signal circuit and providing the third signal to the first clock signal circuit to thereby permit the first clock signal circuit to change from the first state to the second state; and after a transition between the first state and the second state, generating a fourth signal at the first clock signal circuit and providing the fourth signal to the third clock signal circuit to thereby permit the third clock signal circuit to change from the second state back to the first state.

5. A method for providing clock signals as in claim 4 wherein the first clock signal circuit comprises a first logic element connected to the second clock signal circuit and connected to the third clock signal circuit and wherein the method further comprises:

providing an output signal from the first logic element only after both the first clock signal circuit and the second clock signal circuit have changed state.

6. A method as in claim 5 wherein the first clock signal circuit further comprises a second logic element connected to the first logic element and to the second clock circuit and the method further comprises:

providing an output signal from the second logic element after either the first clock circuit or the second clock circuit changes states.

* * * * *